(12) United States Patent
Shiokawa et al.

(10) Patent No.: US 10,651,366 B2
(45) Date of Patent: May 12, 2020

(54) SPIN CURRENT MAGNETIZATION REVERSAL ELEMENT AND MAGNETIC MEMORY

(71) Applicant: TDK CORPORATION, Tokyo (JP)

(72) Inventors: Yohei Shiokawa, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/113,592

(22) Filed: Aug. 27, 2018

(65) Prior Publication Data

US 2019/0074430 A1    Mar. 7, 2019

(30) Foreign Application Priority Data

Sep. 1, 2017   (JP) ................... 2017-168935

(51) Int. Cl.
| | |
|---|---|
| H01L 29/82 | (2006.01) |
| H01L 43/02 | (2006.01) |
| H01L 43/06 | (2006.01) |
| G11C 11/18 | (2006.01) |
| H01L 43/08 | (2006.01) |
| G11C 11/16 | (2006.01) |
| H01L 27/22 | (2006.01) |
| H01L 43/10 | (2006.01) |
| H01L 43/12 | (2006.01) |

(52) U.S. Cl.
CPC ............ *H01L 43/02* (2013.01); *G11C 11/161* (2013.01); *G11C 11/1675* (2013.01); *G11C 11/18* (2013.01); *H01L 27/222* (2013.01); *H01L 43/06* (2013.01); *H01L 43/08* (2013.01); *H01L 43/10* (2013.01); *H01L 43/12* (2013.01)

(58) Field of Classification Search
CPC ...................................................... H01L 43/02
USPC ........................................................ 257/421
See application file for complete search history.

(56) References Cited

U.S. PATENT DOCUMENTS

| | | | |
|---|---|---|---|
| 8,350,347 B2 | 1/2013 | Gaudin et al. | |
| 2013/0288394 A1* | 10/2013 | Kontos | H01L 43/02 438/3 |
| 2015/0348606 A1 | 12/2015 | Buhrman et al. | |
| 2017/0222135 A1* | 8/2017 | Fukami | H01L 43/08 |

FOREIGN PATENT DOCUMENTS

| | | | | |
|---|---|---|---|---|
| FR | 2963153 A1 * | 1/2012 | ............. | B82Y 25/00 |
| WO | 2016/021468 A1 | 2/2016 | | |

OTHER PUBLICATIONS

Fukami et al. "Magnetization switching by spin-orbit torque in an antiferromagnet-ferromagnet bilayer system". Nature Materials, pp. 535-541, 2016, DOI: 10.1038/NMAT4566.

(Continued)

*Primary Examiner* — Ajay Arora
(74) *Attorney, Agent, or Firm* — Oliff PLC

(57) ABSTRACT

A spin flow magnetization reversal element includes a first ferromagnetic metal layer capable of changing a direction of magnetization; and a spin orbit torque wiring layer joined to the first ferromagnetic metal layer and extending in a direction intersecting a direction perpendicular to a plane of the first ferromagnetic metal layer. The spin orbit torque wiring layer includes at least one light element L among B, C, Si and P and at least one noble gas element among Ar, Kr and Xe.

18 Claims, 3 Drawing Sheets

(56) References Cited

OTHER PUBLICATIONS

Nguyen et al. "Spin Torque Study of the Spin Hall Conductivity and Spin Diffusion Length in Platinum Thin Films with Varying Resistivity." Physical Review Letters, vol. 116, No. 126601, pp. 1-18, 2016, DOI:10.1103.

Kato et al. "Observation of the Spin Hall Effect in Semiconductors." Science, vol. 306, pp. 1910-1913, 2004.

Miron et al.. "Perpendicular switching of a single ferromagnetic layer induced by in-plane current injection." Nature, vol. 476, pp. 189-193, 2011.

Liu et al. "Spin torque switching with the giant spin Hall effect of tantalum." Science, vol. 336, No. 555, pp. 1-19 and 12 pages of supporting material, 2012.

Liu et al. "Current-Induced Switching of Perpendicularly Magnetized Magnetic Layers Using Spin Torque from the Spin Hall Effect." Physical Review Letters, vol. 109, pp. 096602-1-096602-5, 2012.

Lee et al. "Threshold current for switching of a perpendicular magnetic layer induced by spin Hall effect." Applied Physics Letters, vol. 102, pp. 112410-1-112410-5, 2013.

Lee et al. "Thermally activated switching of perpendicular magnet by spin-orbit spin torque." Applied Physics Letters, vol. 104, pp. 072413-1-072413-5, 2014.

Fukami et al. "A spin-orbit torque switching scheme with collinear magnetic easy axis and current configuration." Nature Nanotechnology, vol. 11, No. 621, pp. 1-5, 2016.

Takahashi et al. "Spin injection and detection in magnetic nanostructures." Physical Review B, vol. 67, pp. 052409-1-052409-4, 2003.

Seo et al. "Area-Efficient SOT-MRAM With a Schottky Diode." IEEE Electron Device Letters, vol. 37, No. 8, pp. 982-985, 2016.

Zhang et al. "Spin Hall Effects in Metallic Antiferromagnets." Physical Review Letters, vol. 113, 196602-1-196602-6, 2014.

* cited by examiner

SPIN CURRENT MAGNETIZATION REVERSAL ELEMENT AND MAGNETIC MEMORY

TECHNICAL FIELD

The present disclosure relates to a spin current magnetization reversal element and a magnetic memory.

Priority is claimed on Japanese Patent Application No. 2017-168935, filed Sep. 1, 2017, the content of which is incorporated herein by reference.

BACKGROUND ART

A giant magnetoresistance (GMR) element including a multilayer film having a ferromagnetic layer and a nonmagnetic layer, and a tunneling magnetoresistance (TMR) element in which an insulating layer (a tunnel barrier layer, and a barrier layer) is used as a nonmagnetic layer are known. In general, a TMR element has a higher element resistance than a GMR element, and its magnetoresistance (MR) ratio is larger than that of a GMR element. Therefore, attention is being paid to TMR elements, as elements for magnetic sensors, high-frequency components, magnetic heads and nonvolatile random access memories (MRAM).

An MRAM reads and writes data by utilizing characteristics in which the element resistance of the TMR element varies when the directions of magnetization of the two ferromagnetic layers sandwiching the insulating layer change. As a writing method of an MRAM, there is a method of writing (magnetization reversal) using a magnetic field generated by a current, or a method of writing (magnetization reversal) using a spin transfer torque (STT) generated by causing a current to flow in a stacking direction of the magnetoresistance effect element. Although the magnetization reversal of the TMR element using an STT is efficient from the viewpoint of energy efficiency, the reversal current density for magnetization reversal is high. In order to improve the durability of a TMR element, it is preferable that the reversal current density be low. This also applies to a GMR element.

In recent years, attention has focused on magnetization reversal which utilizes a pure spin current generated by a spin orbit interaction (for example, Non-Patent Document 1), as method for reducing the reversal current provided by a mechanism different from an STT. A pure spin current caused by a spin orbit interaction or the Rashba effect at an interface of dissimilar materials induces a spin orbital torque (SOT) and causes magnetization reversal using an SOT. Also, even with a pure spin current caused by the Rashba effect at an interface of dissimilar materials, a similar magnetization reversal due to an SOT occurs. However, these mechanisms have not yet been clarified. Pure spin current is created by the same number of electrons of upward spin and electrons of downward spin flowing in mutually opposite directions, and the flows of electric charge cancel each other out. Therefore, the current flowing through the magnetoresistance effect element is zero and does not damage the magnetoresistance effect element.

However, it has been reported in Non-Patent Document 1 that the reversal current density due to an SOT in the current element structure is about the same as the reversal current density due to an STT. Although a current flow that produces a pure spin current does not damage a magnetoresistance effect element, reduction of the reversal current density is required from the viewpoint of driving efficiency. In order to reduce the reversal current density, it is necessary to generate a pure spin current more efficiently. Non-Patent Document 2 discloses that the generation efficiency of a pure spin current increases as the resistivity of the spin orbit torque wiring which is a member for generation increases. If the generation efficiency of pure spin current increases, the current density (reversal current density) for reversing the magnetization can be kept low, and in order to realize this, there is a requirement for a technique for increasing the resistivity of the spin orbit torque wiring.

PRIOR ART LITERATURE

Non-Patent Documents

[Non-Patent Document 1] S. Fukami, C. Zhang, S. Dutta Gupta, A. Kurenkov and H. Ohno, Nature materials (2016). DOI: 10.1038/NMAT 4566

[Non-Patent Document 2] M. H. Nguyen, D. C. Ralph, R. A. Buhrman, Physical Review Letters 116, 126601 (2016) DOI: 10.1103

SUMMARY OF THE INVENTION

Technical Problem

The present disclosure has been made in view of the above circumstances, and an object thereof is to provide a spin current magnetization reversal element and a magnetic memory capable of reducing a reversal current density by efficiently generating pure spin current.

Solution to Problem

In order to solve the above problem, the present disclosure provides the following means.

(1) A spin current magnetization reversal element according to one aspect of the present disclosure includes: a first ferromagnetic metal layer of which a direction of magnetization is able to be changed; and a spin orbit torque wiring layer joined to the first ferromagnetic metal layer and extending in a direction intersecting a direction perpendicular to a plane of the first ferromagnetic metal layer, wherein the spin orbit torque wiring layer includes at least one light element selected from a group consisting of B, C, Si and P and at least one noble gas element selected from a group consisting of Ar, Kr and Xe.

(2) In the spin current magnetization reversal element according to the above (1), it is preferable to have an insertion layer including at least one element selected from a group consisting of Ta, W, Mo, Cr, Ru, Rh, Ir, Pd and Pt inside the first ferromagnetic metal layer or between the first ferromagnetic metal layer and the spin orbit torque wiring layer.

(3) In the spin current magnetization reversal element according to any one of the above (1) and (2), at least one of oxygen and nitrogen may be contained in the spin orbit torque wiring layer.

(4) In the spin current magnetization reversal element according to any one of above (1) to (3), a nonmagnetic layer and a second ferromagnetic metal layer may be sequentially stacked on the first ferromagnetic metal layer, on a side opposite to the spin orbit torque wiring layer with the first ferromagnetic metal layer therebetween.

(5) A magnetic memory according to one aspect of the present disclosure includes a plurality of spin current magnetization reversal elements according to any one of above (1) to (4).

Advantageous Effects of Invention

Since the spin orbit torque wiring layer according to the present embodiment includes at least one light element selected from a group consisting of B, C, Si, and P, the basic skeleton of the crystal structure becomes distorted, and the periodic structure collapses, and becomes amorphous or microcrystalline. Furthermore, since the spin orbit torque wiring layer according to the present embodiment contains any one noble gas element selected from a group consisting of Ar, Kr, and Xe, a grain boundary is generated inside, and B, C, Si and P easily diffuse into the grain boundary, the spin orbit torque wiring layer is configured to assist (promote) amorphization or microcrystallization of the spin orbit torque wiring layer due to the light element. Therefore, the spin orbit torque wiring layer of the present disclosure enters a state in which an electrical resistivity becomes higher than in a case in which a light element and a noble gas element are not contained, and a pure spin current easily occurs. Therefore, when a spin current magnetization reversal element of the present embodiment is operated using this, it is possible to reduce the current density (reversal current density) for reversing the magnetization of the first ferromagnetic metal layer.

BRIEF DESCRIPTION OF THE DRAWINGS

FIG. 1(a) is a plan view thereof and FIG. 1(b) is a cross-sectional view thereof.

BEST MODE FOR CARRYING OUT THE INVENTION

Figure 1:
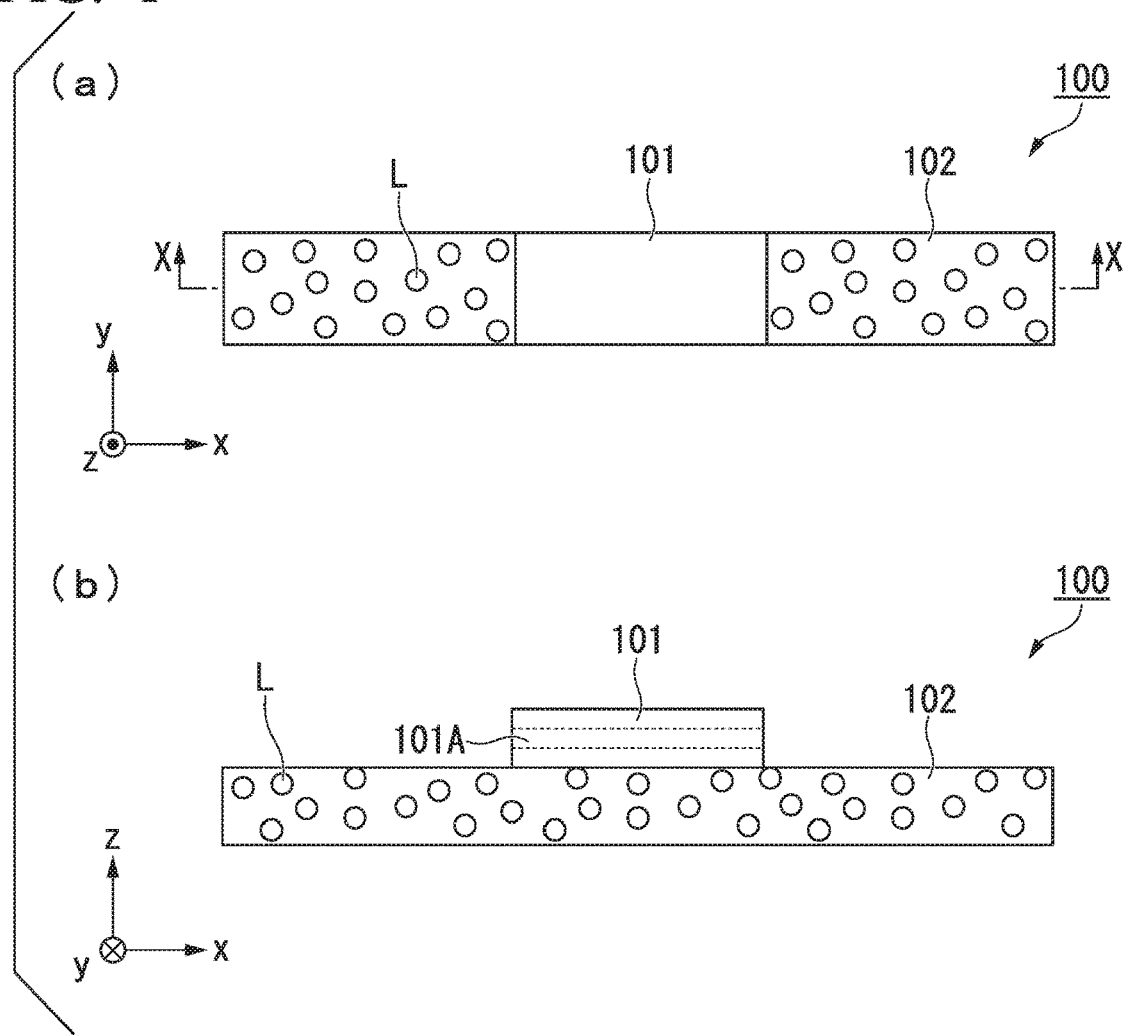
FIG. 1 is a diagram schematically illustrating a configuration of a spin current magnetization reversal element according to a first embodiment of the present disclosure.

Hereinafter, the present disclosure will be described in detail with reference to the drawings as appropriate. In the drawings used in the following description, for the sake of clarity of the features of the present disclosure, in some cases, characteristic portions are enlarged for the sake of convenience, and the dimensional proportions or the like of each component may be different from the actual ones. The materials, dimensions, and the like exemplified in the following description are merely examples, and the present disclosure is not limited thereto, and can be realized by appropriate modification within a range in which the effects of the present disclosure are exerted. In the element of the present disclosure, other layers may be provided as long as the effects of the present disclosure are achieved.

[First Embodiment]

FIG. 1 is a diagram schematically illustrating a configuration of a spin current magnetization reversal element 100 according to a first embodiment of the present disclosure. The spin current magnetization reversal element 100 has a first ferromagnetic metal layer 101 capable of changing the direction of magnetization, and a spin orbit torque wiring layer 102 joined to one surface of the first ferromagnetic metal layer 101 and extending in a direction intersecting a direction perpendicular to a plane (z direction) of the first ferromagnetic metal layer 101. Here, the case in which the spin orbit torque wiring layer 102 extends in a direction (x direction) orthogonal to the direction perpendicular to the plane of the first ferromagnetic metal layer 101 is illustrated.

FIG. 1(a) is a plan view of the spin current magnetization reversal element 100 when viewed from the side of the first ferromagnetic metal layer 101. FIG. 1(b) is a cross-sectional view of the spin current magnetization reversal element 100 when cut to be parallel to the stacking direction of the first ferromagnetic metal layer 101 and the spin orbit torque wiring layer 102.

The spin current magnetization reversal element 100 is an element that performs magnetization reversal of the ferromagnetic metal layer, using the spin orbit torque (SOT) due to the pure spin current, and can be used by being incorporated in a magnetoresistance effect element or the like. On the other hand, the spin current magnetization reversal element 100 can also be used as assistance device or main force device for magnetization reversal of the ferromagnetic metal layer in a conventional magnetoresistance effect element which uses an STT.

The first ferromagnetic metal layer 101 is called a free layer or the like, and is formed of a known material (preferably a soft magnetic material) having ferromagnetism, for example, a metal selected from a group consisting of Cr, Mn, Co, Fe and Ni, ferromagnetic alloys containing at least one of these metals or the like. Further, in some cases, the first ferromagnetic metal layer 101 may be formed of an alloy containing these metals and at least one kind of element selected from a group consisting of B, C and N (specifically, Co—Fe or Co—Fe—B) or the like.

In order to obtain a higher output, it is preferable to use a Heusler alloy such as $Co_2FeSi$. A Heusler alloy contains an intermetallic compound having a chemical composition of $X_2YZ$, where X is a transition metal element or a noble metal element from the Co, Fe, Ni, or Cu groups in the periodic table, Y is a transition metal from the Mn, V, Cr or Ti groups and can also be the types of element as for X, and Z is a typical element from Group III to Group V. For example, $Co_2FeSi$, $Co_2MnSi$, $Co_2Mn_{1-a}Fe_aAl_bSi_{1-b}$ and the like can be adopted.

The first ferromagnetic metal layer 101 preferably has an insertion layer 101A containing at least one of Ta, W, Mo, Cr, Ru, Rh, Ir, Pd and Pt. Since the insertion layer 101A has the function of absorbing B, diffusion of B from the first ferromagnetic metal layer 101 to the spin orbit torque wiring layer 102 is prevented, and it is possible to prevent the composition ratio of the spin orbit torque wiring layer 102 from being disturbed.

Furthermore, the insertion layer 101A can impart perpendicular magnetic anisotropy to the first ferromagnetic metal layer 101 by its interface magnetic anisotropy.

Further, the insertion layer 101A can also serve as a base layer of the first ferromagnetic metal layer, which greatly contributes to the magnetoresistance effect. The magnetoresistance effect can be improved by the crystal orientation of the first ferromagnetic metal layer 101 via the insertion layer 101A rather than the crystal orientation from the amorphous or microcrystallized spin orbit torque wiring layer.

The insertion layer 101A may be located at any position in the first ferromagnetic metal layer 101 and may be located at the interface with the spin orbit torque wiring layer 102, and its thickness is preferably 0.1 nm or more and 2.5 nm or less.

The spin orbit torque wiring layer 102 is formed of an alloy, an intermetallic compound, a metal boride, a metal carbide, a metal silicide, or metal phosphide having a function of generating a pure spin current by a spin Hall effect when a current flows.

Figure 2:
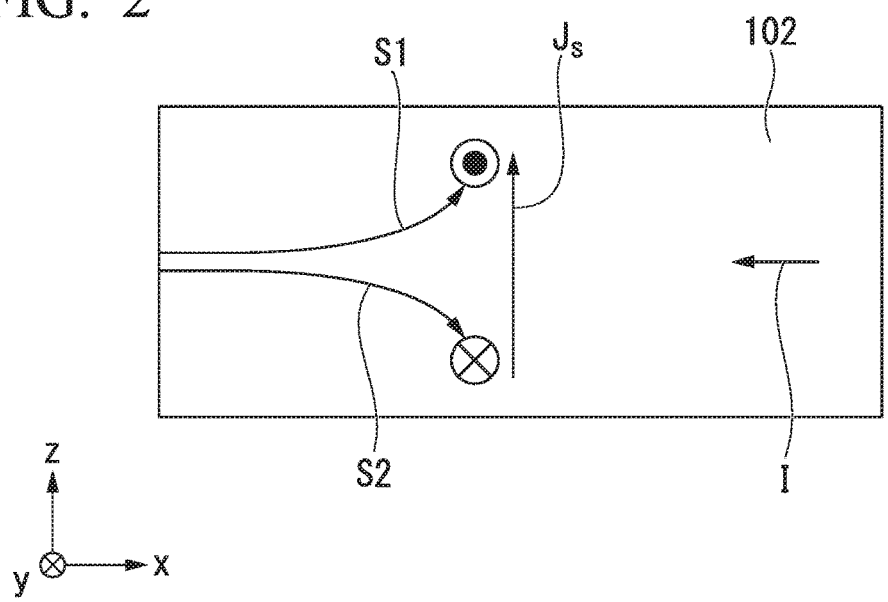
FIG. 2 is a schematic diagram illustrating a spin Hall effect.

FIG. 2 is a schematic view illustrating the spin Hall effect generated in the spin orbit torque wiring layer 102 of FIG. 1, and is a cross-sectional view of the spin orbit torque wiring layer 102 when taken along the x direction. The mechanism in which a pure spin current is generated by the spin Hall effect will be described on the basis of FIG. 2.

As illustrated in FIG. 2, when a current I flows in an extension direction (−x direction) of the spin orbit torque wiring layer 102, the first spin S1 oriented in the −y direction and the second spin S2 oriented in the +y direction are each bent in a direction orthogonal to the direction of the current I. The normal Hall effect and the spin Hall effect are the same in that the motion (movement) of electrical charge (electrons) is bent in the direction of motion (movement). However, the ordinary Hall effect occurs only when a magnetic field is present, whereas the spin Hall effect differs greatly in that it occurs only due to the movement of electrons due to the internal field resulting from the collapse of spatial inversion symmetry (only by flow of current), even if no magnetic field is present.

Since the number of electrons in the first spin S1 is equal to the number of electrons in the second spin S2 in the non-magnetic material (material which is not ferromagnetic material), the number of electrons in the first spin Si directed upward in the drawing is equal to the number of electrons of the second spin S2 directed downward lower direction. Therefore, the current as a net flow of charge is zero. The spin current not accompanied by the current is particularly called pure spin current.

In the case where a current is caused to flow through the ferromagnetic material, the fact that the first spin S1 and the second spin S2 are bent in opposite directions is the same. On the other hand, there is a different in which there may be a state in which either one of the first spin S1 or the second spin S2 is larger in the ferromagnetic material, and as a result, there is a point in which a net flow of charges occurs (voltage is generated). Therefore, as a material of the spin orbit torque wiring layer 102, a material formed only of a ferromagnetic material is not included.

Here, when the flow of the spin of the first spin S1 is denoted by $J\uparrow$, the flow of the spin of the second spin S2 is denoted by $J\downarrow$, and the spin current is denoted by $J_S$, the relation is defined by $J_S = J\uparrow - J\downarrow$. In FIG. 2, $J_S$ flows in an upward direction in the drawing as a pure spin current. Here, $J_S$ is a flow of pure spin with a polarizability of 100%.

As illustrated in FIG. 1, when a ferromagnetic material is brought into contact with the upper surface of the spin orbit torque wiring layer 102, the pure spin current flows to diffuse into the ferromagnetic material. That is, spin is implanted into the first ferromagnetic metal layer 101.

The spin current magnetization reversal element 100 according to the present embodiment causes a current to flow through the spin orbit torque wiring layer 102 to generate a pure spin current and the pure spin current diffuses into the first ferromagnetic metal layer 101 abutting the spin orbit torque wiring layer 102, thereby causing the magnetization reversal of the first ferromagnetic metal layer 101 accompanying the spin orbit torque (SOT) effect due to the pure spin current.

From the viewpoint of an efficiency of generation of the pure spin current, as the material of the spin orbit torque wiring layer 102, it is preferable to use a heavy metal element having an atomic number of 39 or more which has d electrons or f electrons in the outermost shell and has a large spin orbit interaction. When the current is caused to flow through a metal having a small atomic number, all the internal electrons move in the direction opposite to the current, regardless of the direction of each spin. In contrast, when a current is caused to flow through a nonmagnetic metal having d electrons or f electron in the outermost shell and having large number of electrons, since the spin orbit interaction is large, the direction of motion of electrons depends on the direction of each spin by the spin Hall effect, and the pure spin current is likely to occur.

The spin orbit torque wiring layer 102 according to this embodiment has a configuration which has a crystal structure of a heavy metal element such as Pt as a basic skeleton, and contains at least one light element L selected from a group consisting of B, C, Si, P and the like and at least one noble gas element (not illustrated) such as Ar, Kr, Xe and the like as an additive element.

The addition of the light element and the noble gas element can be performed by a known method, for example, an ion implantation method, a plasma doping method, a laser doping method, a co-sputtering method, an ion gun-assisted film formation method, or the like.

In each doping method, injection of a light element is easy, but limitation on penetration depth or concentration distribution of implantation elements may occur. From the viewpoint of spin current generation, this concentration distribution may occur. In the sputtering method using an alloy target, it is also possible to add the light element without concentration distribution. However, since the alloy target becomes brittle when the light element is added, there is a possibility that the addition amount may be limited, but for example, it is possible to adjust the amount of addition by adjusting each sputtering condition, using the co-sputtering method of a heavy metal element target and a light element target.

Furthermore, although it is also possible to add a noble gas by increasing the amount of noble gas used at the time of sputtering, it is possible to more efficiently add the noble gas, by increasing the noble gases to be used to two types (Ar+Kr).

Furthermore, the noble gas can be further added, using an ion gun assisted film formation method in which a film is formed, while radiating a plasma ions such as Ar, Kr and Xe at the time of sputtering.

The proportion of the light element contained in the spin orbit torque wiring layer 102 is preferably 5 atm % or more and 50 atm % or less.

In the case where the content of the light element is 5 atm % or more, the constituent materials of the spin orbit torque wiring layer 102 are not alloyed and become intermetallic compounds, and B, C, Si and P are likely to segregate at the grain boundary. Therefore, microcrystallization of the spin orbit torque wiring layer 102 is further promoted and the electrical resistivity is increased.

When the content ratio of the light element is 10 atm % or more, a part of the constituent material of the spin orbit torque wiring layer 102 is alloyed, and the electric resistivity of the spin orbit torque wiring layer 102 further increases.

It is preferable that the spin orbit torque wiring layer 102 include at least one of elements having a large atomic radius (oxygen, nitrogen, etc.). In this case, since the grain boundary is generated in the spin orbit torque wiring layer 102, and B, C, Si and P are easily diffused into the grain boundary, amorphization and microcrystallization are further promoted.

As described above, since the spin orbit torque wiring layer 102 according to the present embodiment includes at least one light element selected from a group consisting of B, C, Si, and P, the basic skeleton of the crystal structure is distorted, and the periodic structure is collapsed, and amorphized or microcrystallized. Furthermore, since the spin orbit torque wiring layer 102 according to the present embodiment contains any one noble gas element among Ar, Kr, and Xe, the grain boundary is generated inside, B, C, Si and P are easily diffused into the grain boundary and the spin orbit torque wiring layer 102 is configured to assist (promote) amorphization or microcrystallization of the spin orbit torque wiring layer 102 by the light element. Therefore, the spin orbit torque wiring layer 102 enters a state in which an electric resistivity becomes higher than a case in which the light element and the noble gas element are not contained, and a pure spin current easily occurs. Therefore, when the spin current magnetization reversal element 100 of the present embodiment is operated using this, it is possible to reduce the current density (reversal current density) for reversing the magnetization of the first ferromagnetic metal layer 101.

[Second Embodiment]

Figure 3:
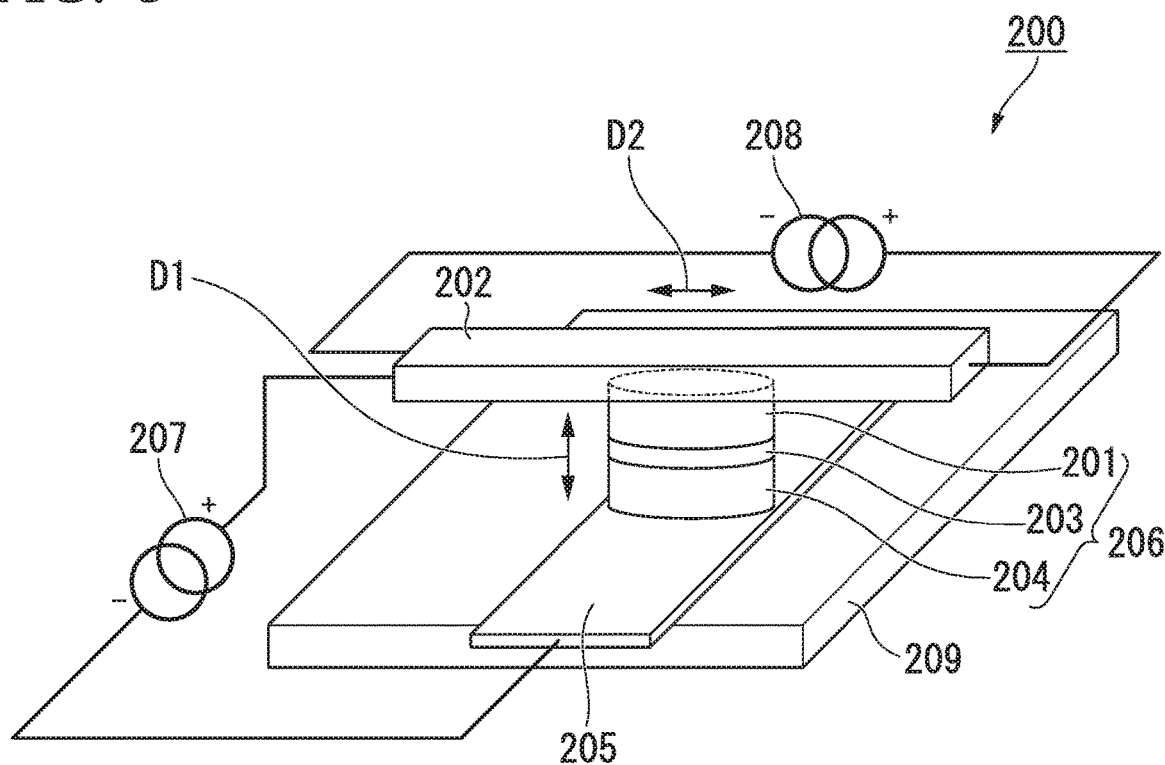
FIG. 3 is a perspective view schematically illustrating a configuration of a spin current magnetization reversal element according to a second embodiment of the present disclosure.

FIG. 3 is a perspective view schematically illustrating a configuration of a spin current magnetization reversal element 200 according to the second embodiment of the present disclosure. The spin current magnetization reversal element 200 is formed by sequentially stacking a first ferromagnetic metal layer 201, a nonmagnetic layer 203, a second ferromagnetic metal layer 204, and a wiring layer 205 on a spin orbit torque wiring layer 202. Furthermore, the spin current magnetization reversal element 200 includes a first power source 207 for causing the current to flow in the stacking direction D1 of the magnetoresistance effect element 206 including the three layers 201, 203 and 204, and a second power source 208 for causing a current to flow in a longitudinal direction D2 of the spin orbit torque wiring layer 202. The magnetoresistance effect element 206 is supported by a substrate 209 via the wiring layer 205.

The spin current magnetization reversal element 200 may operate the reversal of the magnetization of the first ferromagnetic metal layer 201, using only the SOT generated by causing a current to flow through the spin orbit torque wiring layer 202, or using the SOT, and STT generated by causing a current to flow through the magnetoresistance effect element 206 in combination.

When the nonmagnetic layer 203 is made of an insulator, the magnetoresistance effect element 206 corresponds to a tunneling magnetoresistance (TMR) element. When the nonmagnetic layer 203 is made of a metal, the magnetoresistance effect element 206 corresponds to a giant a magnetoresistance (GMR) element.

The magnetoresistance effect element 206 functions by the magnetization of the second ferromagnetic metal layer 204 being fixed in one direction and the direction of magnetization of the first ferromagnetic metal layer 201 being relatively changed. When applied to a coercive force difference type (pseudo spin valve type) MRAM, the coercive force of the second ferromagnetic metal layer 204 is set to be greater than the coercive force of the first ferromagnetic metal layer 201. Further, when applied to an exchange bias type (spin valve type) MRAM, the magnetization of the second ferromagnetic metal layer 204 is fixed by exchange coupling with the antiferromagnetic layer.

The first ferromagnetic metal layer 201 and the spin orbit torque wiring layer 202 of this embodiment each have the same configuration as the first ferromagnetic metal layer 101 and the spin orbit torque wiring layer 102 of the first embodiment. Therefore, even in the spin current magnetization reversal element 200 of the present embodiment, the same effect as that of the spin current magnetization reversal element 100 of the first embodiment can be obtained.

The second ferromagnetic metal layer 204 and the first ferromagnetic metal layer 201 may be an in-plane magnetization film in which the direction of magnetization is parallel to the surface of each layer, or may be a perpendicular magnetization film perpendicular to the surface of each layer.

As the material of the second ferromagnetic metal layer 204, a known material can be used, for example, it is possible to use a metal selected from the group consisting of Cr, Mn, Co, Fe and Ni, and an alloy exhibiting ferromagnetism containing one or more of these metals. Further, it is also possible to use an alloy containing these metals and at least one or more kinds of B, C, and N. For example, Co—Fe or Co—Fe—B can be used.

In order to obtain a higher output, it is preferable to use a Heusler alloy such as $Co_2FeSi$. The Heusler alloy contains an intermetallic compound having a chemical composition of $X_2YZ$, X is a transition metal element or a noble metal element of Co, Fe, Ni, or Cu group on the periodic table, Y is a transition metal element of Mn, V, Cr or Ti group, the elemental species of X can be removed, and Z is a typical element of group III to group V. For example, $Co_2FeSi$, $Co_2MnSi$, $Co_2Mn_{1-a}Fe_aAl_bSi_{1-b}$ and the like can be used.

In order to further increase the coercive force of the second ferromagnetic metal layer 204 with respect to the first ferromagnetic metal layer 201, a layer of an antiferromagnetic material such as IrMn and PtMn may be used as a pinning layer on the second ferromagnetic metal layer 104. Further, in order to prevent the leakage magnetic field of the second ferromagnetic metal layer 204 from affecting the first ferromagnetic metal layer 201, a synthetic ferromagnetic coupling structure may be adopted.

Further, when the direction of magnetization of the second ferromagnetic metal layer 204 is made perpendicular to the stacking plane, it is preferable to use a stacked film of Co and Pt. Specifically, the second ferromagnetic metal layer 204 can be formed of [Co (0.24 nm)/Pt (0.16 nm)]6/Ru (0.9 nm)/[Pt (0.16 nm)/Co (0.16 nm)] 4/Ta (0.2 nm)/FeB (1.0 nm). Numbers in parentheses indicate film thickness.

In the case where the direction of magnetization of the first ferromagnetic metal layer 201 is perpendicular to the stacked surface, it is preferable that the thickness of the first ferromagnetic metal layer 201 be 2.5 nm or less. In maintaining the perpendicular magnetic anisotropy added to the first ferromagnetic metal layer 201, the first ferromagnetic metal layer 201 is preferably thin.

A known material can be used as the nonmagnetic layer 203. For example, when the nonmagnetic layer 203 is made of an insulator, $Al_2O_3$, $SiO_2$, MgO, $MgAl_2O_4$, or the like can be used as the material thereof. In addition to these materials, it is also possible to use a material in which a part of Al, Si and Mg is substituted with Zn, Be or the like. Among them, since MgO and $MgAl_2O_4$ are materials that achieve coherent tunneling, the spin can be efficiently implanted. When the nonmagnetic layer 203 is made of a metal, Cu, Au, Ag, or the like can be used as the material thereof.

The substrate 209 is preferably excellent in flatness, and for example, Si, Al, Ti, C, or the like can be used as a material thereof.

A base layer (not illustrated) may be formed between the substrate 209 and the wiring layer 205. By providing the base layer, it is possible to control the crystallinity (crystal orientation property, crystal grain diameter, etc.) of each layer constituting the magnetoresistance effect element 206.

In order to prevent the current flowing through the wiring layer 205 and the like from dissipating, it is preferable that the base layer has insulating properties. As the base layer, as an example, it is possible to use a nitride layer which has a (001)-oriented NaCl structure and contains at least one element selected from the group consisting of Ti, Zr, Nb, V, Hf, Ta, Mo, W, B, Al and Ce.

As another example, as the base layer, it is possible to use a layer of a (002)-oriented perovskite-based conductive oxide represented by a composition formula of $XYO_3$. Here, the site X contains at least one element selected from the group consisting of Sr, Ce, Dy, La, K, Ca, Na, Pb and Ba, and the site Y contains at least one element selected from the group consisting of Ti, V, Cr, Mn, Fe, Co, Ni, Ga, Nb, Mo, Ru, Ir, Ta, Ce and Pb.

As another example, as the base layer, it is possible to use a layer of an oxide having a (001)-oriented NaCl structure and containing at least one element selected from the group consisting of Mg, Al and Ce.

As another example, as the base layer, it is possible to use a layer which has a (001)-oriented tetragonal structure or a cubic crystal structure and contains at least one element selected from the group consisting of Al, Cr, Fe, Co, Rh, Pd, Ag, Ir, Pt, Au, Mo and W.

Further, the base layer need not be a single layer, and it may be a layer obtained by stacking a plurality of the above-mentioned layers. By devising the structure of the base layer, the crystallinity of each layer of the magnetoresistance effect element 206 can be enhanced and the magnetic characteristics can be improved.

The wiring layer 205 is configured so that it is electrically connected to the second ferromagnetic metal layer 204, as illustrated in FIG. 3, a closed circuit is formed by the wiring layer 205, the spin orbit torque wiring layer 202 and the first power source 207, and the current flows in the stacking direction of the magnetoresistance effect element 206.

As the material of the wiring layer 205, any material may be used as long as it has high conductivity, and for example, Al, Ag, Cu, Au, or the like can be used.

The above-described embodiment describes an example of a so-called bottom pin structure in which, in the magnetoresistance effect element 206, the first ferromagnetic metal layer 201 having the later stacking order and disposed on the side farther from the substrate 209 is a magnetization free layer, and the second ferromagnetic metal layer 204 having the earlier stacking order and disposed on the side closer to the substrate 209 is a magnetization fixed layer (pinned layer). However, the structure of the magnetoresistance effect element 206 is not particularly limited, and a so-called top pin structure may be used.

As the material of the first power source 207 and the second power source 208, known materials can be used. The first power source 207 is connected to the wiring layer 205 and the spin orbit torque wiring layer 202. The first power source 207 can control the current flowing in the stacking direction D1 of the magnetoresistance effect element 206. The second power source 208 is connected to both ends of the spin orbit torque wiring 202 in the longitudinal direction D2. The second power source 208 can control the current flowing in the direction D2 orthogonal to the stacking direction D1 of the magnetoresistance effect element 206.

As described above, the current flowing in the stacking direction D1 of the magnetoresistance effect element 206 induces STT, and the current flowing in the longitudinal direction D2 of the spin orbit torque wiring 202 induces SOT. Both the STT and the SOT contribute to the magnetization reversal of the first ferromagnetic metal layer 201.

The SOT and STT contribution ratios of the amount of current flowing through the magnetoresistance effect element 206 and the amount of current flowing through the spin orbit torque wiring layer 202 can be controlled freely, using the first power source 207 and the second power source 208, respectively.

For example, when a large current cannot flow through the device, a control is performed so that STT with high energy efficiency for magnetization reversal mainly contributes. That is, the amount of current of the first power source 207 is increased, and the amount of current of the second power source 208 is decreased. Further, for example, in the case in which it is necessary to manufacture a thin device and the thickness of the nonmagnetic layer 203 has to be reduced, it is required to reduce the current flowing through the nonmagnetic layer 203. In this case, the amount of current provided by the first power source 207 is decreased, the amount of current provided by the second power source 208 is increased, and the contribution ratio of SOT is increased.

As described above, according to the magnetoresistance effect element of the present embodiment configured to be able to use the STT method and the SOT method in combination, the contribution ratio of STT and SOT can be freely controlled by the amount of current supplied from the first power source 207 and the second power source 208. Therefore, the spin current magnetization reversal element 200 of the present embodiment can freely control the contribution ratio of STT and SOT in accordance with the performance required of the device, and can function as a more versatile magnetoresistance effect element.

In addition to the above, the spin current magnetization reversal element 200 according to the present embodiment can also be applied to, for example, a spatial light modulator, a magnetic sensor, and the like. When applied to the spatial light modulator, it is possible to spatially modulate incident light by arranging the spin current magnetization reversal element in each pixel and utilizing the magneto-optical effect. When applied to the magnetic sensor, in order to avoid the influence of hysteresis due to the coercive force of the magnet, the magnetic field generation source applied to the magnetization easy axis of the magnet may be replaced by spin orbit torque wiring.

(Manufacturing Method)

The method of manufacturing the spin current magnetization reversal element of the present disclosure and the magnetoresistance effect element provided with the spin current magnetization reversal element are not particularly limited, and it is possible to use a known film formation method, such as a physical vapor deposition (PVD) method and a chemical vapor deposition (CVD) method. As the physical vapor deposition method, for example, it is possible to use a resistance heating vapor deposition, an electron beam vapor deposition, a molecular beam epitaxy (MBE) method, an ion plating method, an ion beam deposition method, a sputtering method, or the like. As a chemical vapor deposition (CVD) method, for example, it is possible to use a thermal CVD method, an optical photo CVD method, a plasma CVD method, a metal-organic vapor phase epitaxy (MOCVD) method, an atomic layer deposition (ALD) method, or the like. Hereinafter, an example of a method for manufacturing a magnetoresistance effect element having a spin current magnetization reversal element will be described, thereby also describing a method of manufacturing a spin current magnetization reversal element in combination.

First, a film of a spin orbit torque wiring layer is formed on a substrate serving as a support by, for example, a sputtering method. Next, the formed film of the spin orbit torque wiring layer is processed into a predetermined shape, using a technique such as photolithography.

Then, portions other than the spin orbit torque wiring layer are covered with an insulating film such as an oxide film, for example, using a CVD method. Alternatively, the surface of the spin orbit torque wiring layer may be oxidized or nitrided to form an insulating layer or a high resistance layer on the surface of the spin orbit torque wiring layer. In this case, at least the surface of the spin orbit torque wiring layer with increased resistance is covered with an insulating film such as an oxide film. The exposed surfaces of the spin orbit torque wiring layer and the insulating film (insulating layer, high resistance layer) are preferably polished by a chemical mechanical polishing (CMP) method.

Next, the first ferromagnetic metal layer, the nonmagnetic layer, and the second ferromagnetic metal layer are sequentially stacked on the spin orbit torque wiring layer, for example, using a sputtering method to form a functional portion of the magnetoresistance effect element. In the case where the functional portion is a TMR element, for example, a tunnel barrier layer is obtained, by forming a metal thin film made up of magnesium, aluminum and a divalent cation of a plurality of nonmagnetic elements of about 0.4 to 2.0 nm on the first ferromagnetic metal layer, using the sputtering method, performing natural oxidation by plasma oxidation or oxygen introduction, and then performing heat treatment.

Since the layer formed by reactive sputtering is amorphous and needs to be crystallized, it is preferable to anneal the obtained functional portion. For example, when Co—Fe—B is used as the ferromagnetic metal layer, a part of B exist to the outside of the ferromagnetic metal layer by annealing treatment and then the ferromagnetic metal layer is crystallized.

The functional portion manufactured by annealing improves the magnetoresistance ratio as compared with the functional portion manufactured without annealing treatment. This is because the uniformity and the orientation of the crystal size of the nonmagnetic layer (tunnel barrier layer) are improved by the annealing treatment.

As the annealing treatment, after heating is performed in an inert atmosphere such as Ar at a temperature range of 300° C. or more and 500° C. or less for 5 minutes or more and 100 minutes or less, it is preferable to perform heating for 1 hour to 10 hours at 100° C. or more and 500° C. or less in a state in which a magnetic field of 2 kOe or more and 10 kOe or less is applied.

As a method of forming the magnetoresistance effect element into a predetermined shape, processing device such as photolithography can be used. First, after stacking the magnetoresistance effect element, a resist is applied to the surface of the magnetoresistance effect element opposite to the spin orbit torque wiring layer. Further, resist of a predetermined portion is cured to remove the unnecessary portion of the resist. The portion in which the resist is cured serves as a protective film of the magnetoresistance effect element. The portion in which the resist is cured coincides with the shape of the finally obtained magnetoresistance effect element.

Further, processes such as ion milling and reactive ion etching (RIE) is performed on the surface on which the protective film is formed. The portion in which the protective film is not formed is removed, and a magnetoresistance effect element of a predetermined shape is obtained.

The present disclosure is not necessarily limited to the configuration and manufacturing method of the spin orbit torque type magnetization reversal element according to the above embodiment, and various modifications can be made within a scope that does not depart from the gist of the present disclosure.

(Magnetic Memory)

The magnetic memory (MRAM) of the present disclosure is provided with a plurality of magnetoresistance effect elements of the present disclosure.

(Magnetization Reversal Method)

In the magnetization reversal method, in the magnetoresistance effect element of the present disclosure, the current density flowing in the spin orbit torque wiring layer can be less than $1 \times 10^7$ A/cm$^2$. When the current density of the current flowing in the spin orbit torque wiring layer is too large, heat is generated by the current flowing in the spin orbit torque wiring layer. When heat is applied to the second ferromagnetic metal layer, in some cases, the stability of the magnetization of the second ferromagnetic metal layer is lost, and unexpected magnetization reversal or the like may occur. If such unexpected magnetization reversal occurs, there arises a problem in that the recorded information is rewritten. That is, in order to avoid unexpected magnetization reversal, it is preferable that the current density of the current flowing through the spin orbit torque wiring layer not become too large. If the current density of the current flowing through the spin orbit torque wiring layer is less than $1 \times 10^7$ A/cm$^2$, it is possible to avoid the occurrence of magnetization reversal due to at least generated heat.

In the magnetization reversal method, when using the STT method and the SOT method in combination in the magnetoresistance effect element of the present disclosure, after a current is applied to the power source of the spin orbit torque wiring layer, a current may be applied to the power source of the magnetoresistance effect element.

The SOT magnetization reversal step and the STT magnetization reversal step may be performed at the same time, or the STT magnetization reversal step may be performed after performing the SOT magnetization reversal step in advance. The current may be supplied from the first power source 207 and the second power source 208 at the same time, or the current may be supplied from the first power source 207 after the current is supplied from the second power source 208. However, in order to more reliably obtain the assist effect of magnetization reversal using SOT, it is preferable to apply the current to the power source of the magnetoresistance effect element after the current is applied to the power source of the spin orbit torque wiring layer. In other words, it is preferable to supply the current from the first power source 207 after supplying the current from the second power source 208.

EXAMPLE

Hereinafter, the effects of the present disclosure will be made clearer by way of examples. It should be noted that the present disclosure is not limited to the following examples, but can be carried out with appropriate modifications within the scope not changing the gist thereof.

Example 1

A magnetoresistance effect element including the spin current magnetization reversal element of the present disclosure was manufactured by the above method. First, after a base layer was formed on a base substrate using the sputtering method, a spin orbit torque wiring layer made of Pt was formed by the sputtering method using Ar, while irradiating Ar ions using an ion gun assist method. Subsequently, B (10 atm %) was added as a light element to the processed spin orbit torque wiring layer, using the ion implantation method.

Next, a first ferromagnetic metal layer, a nonmagnetic layer and a second ferromagnetic metal layer were sequentially stacked on a spin orbit torque wiring layer containing a light element B and a noble gas element Ar, using the sputtering method, thereby forming a functional portion of the resistance element. CoFeB was used as the material of the first ferromagnetic metal layer. MgO was used as a material of the nonmagnetic material. CoFeB/Ru/[Co/Pt]n was used as the material of the second ferromagnetic metal layer. An annealing treatment was performed on the formed functional portion at 300° C. for 120 minutes. Thereafter, it was processed into a predetermined shape.

Figure 4:
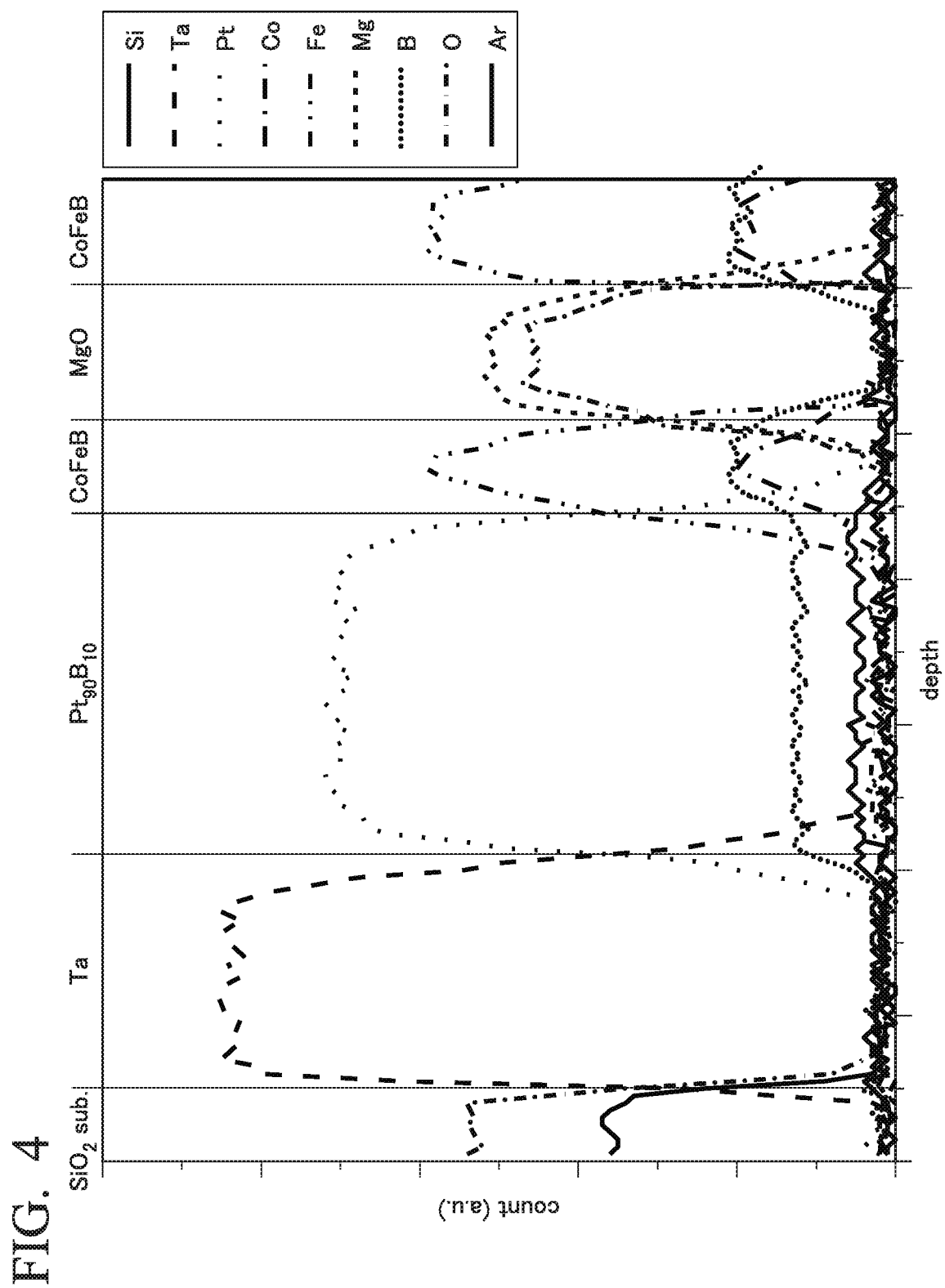
FIG. 4 is a graph illustrating a result of EDX (energy-dispersive X-ray analysis) for the spin current magnetization reversal element according to the second embodiment of the present disclosure.

Further, in order to check the addition amount of each element, the composition distribution was checked, using EDX (energy-dispersive X-ray analysis) after observing the cross-section with TEM (transmission electron microscope). A graph of the composition distribution is illustrated in FIG. 4. From the results of EDX, it was possible to check that B and Ar were added to the spin orbit torque wiring layer.

Next, at least a part of the plate-shaped wiring layer was superimposed on the second ferromagnetic metal wiring layer and fixed with an adhesive or the like. Further, one end side of the first power source was electrically connected to the spin orbit torque wiring layer, and the other end side of the first power source was electrically connected to the second ferromagnetic metal layer. Further, one end side of the second power source was electrically connected to one end side of the spin orbit torque wiring layer, and the other end side of the second power source was electrically connected to the other end side of the spin orbit torque wiring layer. A sample of the magnetoresistance effect element was obtained in this way.

Example 2

A sample of a magnetoresistance effect element was fabricated in the same manner as in Example 1 except that C was added as a light element to the spin orbit torque wiring layer.

Example 3

A sample of the magnetoresistance effect element was manufactured in the same manner as in Example 1 except that Si was added as a light element to the spin orbit torque wiring layer and the Kr ion gun assist method was used.

Example 4

A sample of a magnetoresistance effect element was manufactured in the same manner as in Example 1 except that P was added as a light element to the spin orbit torque wiring layer and the Xe ion gun assist method was used.

Comparative Example 1

A sample of a magnetoresistance effect element was manufactured in the same manner as in Example 1 except that no light element was added to the spin orbit torque wiring layer.

Regarding the samples of the magnetoresistance effect elements obtained in Examples 1 to 4 and Comparative Example 1, the light element contained in the spin orbit torque wiring layer, the electric resistivity of the spin orbit torque wiring layer, and the reversal current density at the time of operation are illustrated in Table 1.

In the resistivity measurement, the film thickness of Pt was fixed at 10 nm, and several thin wires with different thickness were processed and measured by four-terminal measurement. The resistivity of Pt to which no noble gas was added was 29.7 $\mu\Omega\cdot cm$.

TABLE 1

| | Light element | | Noble gas element | | | Reversal |
|---|---|---|---|---|---|---|
| | Element name | Content ratio [atm %] | Element name | Content ratio [atm %] | Electric resistivity [$\mu\Omega \cdot cm$] | current density [A/cm$^2$] |
| Example 1 | B | 10 | Ar | 1.5 | 92.5 | $7.1 \times 10^6$ |
| Example 2 | C | 5 | Ar | 1.5 | 105.2 | $5.9 \times 10^6$ |
| Example 3 | Si | 5 | Kr | 1.2 | 99.4 | $6.9 \times 10^6$ |
| Example 4 | P | 5 | Xe | 1.0 | 107.5 | $5.8 \times 10^6$ |
| Comparative Example 1 | — | — | Ar | 1.5 | 58.2 | $1.2 \times 10^7$ |

Each of the spin orbit torque wiring layers (Examples 1 to 4) to which B, C, Si, and P was added as the light elements had an enhanced electrical resistivity as compared to the spin orbit torque wiring layer to which no light element was added (Comparative Example 1), and is in a state in which the pure spin current easily occurs, and as a result, the reversal current density with respect to the magnetization of the first ferromagnetic metal layer can be reduced.

EXPLANATION OF REFERENCES 100, 200 Spin current magnetization reversal element
101, 201 First ferromagnetic metal layer
101A Insertion layer
102, 202 Spin orbit torque wiring layer
203 Nonmagnetic layer
204 Second ferromagnetic metal layer
205 Wiring layer
206 Magnetoresistance effect element
207 First power source
208 Second power source
209 Substrate
D1 Stacking direction of functional portion
D2 Longitudinal direction of spin orbit torque wiring layer
1 Current
Js Spin current
L Light element
S1 First spin
S2 Second spin

What is claimed is:
1. A spin current magnetization reversal element, comprising:
 a first ferromagnetic metal layer capable of changing a direction of magnetization; and
 a spin orbit torque wiring layer joined to the first ferromagnetic metal layer and extending in a direction intersecting a direction perpendicular to a plane of the first ferromagnetic metal layer, wherein the spin orbit torque wiring layer includes at least one light element selected from a group consisting of B, C, Si and P and at least one noble gas element selected from a group consisting of Ar, Kr and Xe.

2. The spin current magnetization reversal element according to claim 1, further comprising:
an insertion layer including at least one element selected from a group consisting of Ta, W, Mo, Cr, Ru, Rh, Ir, Pd and Pt inside the first ferromagnetic metal layer or between the first ferromagnetic metal layer and the spin orbit torque wiring layer.

3. The spin current magnetization reversal element according to claim 1, wherein at least one of oxygen and nitrogen is contained in the spin orbit torque wiring layer.

4. The spin current magnetization reversal element according to claim 2, wherein at least one of oxygen and nitrogen is contained in the spin orbit torque wiring layer.

5. The spin current magnetization reversal element according to claim 1, wherein a nonmagnetic layer and a second ferromagnetic metal layer are sequentially stacked on the first ferromagnetic metal layer on a side opposite to the spin orbit torque wiring layer across the first ferromagnetic metal layer.

6. The spin current magnetization reversal element according to claim 2, wherein a nonmagnetic layer and a second ferromagnetic metal layer are sequentially stacked on the first ferromagnetic metal layer on a side opposite to the spin orbit torque wiring layer across the first ferromagnetic metal layer.

7. The spin current magnetization reversal element according to claim 3, wherein a nonmagnetic layer and a second ferromagnetic metal layer are sequentially stacked on the first ferromagnetic metal layer on a side opposite to the spin orbit torque wiring layer across the first ferromagnetic metal layer.

8. The spin current magnetization reversal element according to claim 4, wherein a nonmagnetic layer and a second ferromagnetic metal layer are sequentially stacked on the first ferromagnetic metal layer on a side opposite to the spin orbit torque wiring layer across the first ferromagnetic metal layer.

9. A magnetic memory comprising a plurality of spin current magnetization reversal elements according to claim 1.

10. A magnetic memory comprising a plurality of spin current magnetization reversal elements according to claim 2.

11. A magnetic memory comprising a plurality of spin current magnetization reversal elements according to claim 3.

12. A magnetic memory comprising a plurality of spin current magnetization reversal elements according to claim 4.

13. A magnetic memory comprising a plurality of spin current magnetization reversal elements according to claim 5.

14. A magnetic memory comprising a plurality of spin current magnetization reversal elements according to claim 6.

15. A magnetic memory comprising a plurality of spin current magnetization reversal elements according to claim 7.

16. A magnetic memory comprising a plurality of spin current magnetization reversal elements according to claim 8.

17. The spin current magnetization reversal element according to claim 1, wherein the at least one noble gas element is selected from a group consisting of Kr and Xe.

18. The spin current magnetization reversal element according to claim 1, wherein the at least one light element is diffused into a grain boundary formed inside the spin orbit torque wiring layer.

* * * * *